United States Patent
Chen

(10) Patent No.: US 10,461,742 B2
(45) Date of Patent: Oct. 29, 2019

(54) CHIP, SELECTABLE MODE BUFFER CIRCUIT AND MODE SELECTING METHOD THEREOF

(71) Applicant: Novatek Microelectronics Corp., Hsinchu (TW)

(72) Inventor: Chun-Hung Chen, Yunlin County (TW)

(73) Assignee: Novatek Microelectronics Corp., Hsinchu (TW)

(*) Notice: Subject to any disclaimer, the term of this patent is extended or adjusted under 35 U.S.C. 154(b) by 26 days.

(21) Appl. No.: 15/255,138

(22) Filed: Sep. 1, 2016

(65) Prior Publication Data

US 2018/0062647 A1 Mar. 1, 2018

(51) Int. Cl.
| | | |
|---|---|---|
| H03K 5/08 | (2006.01) | |
| H03F 3/45 | (2006.01) | |
| H02M 3/04 | (2006.01) | |
| G11C 11/4074 | (2006.01) | |
| H03K 17/16 | (2006.01) | |
| H03K 17/687 | (2006.01) | |
| H02M 3/07 | (2006.01) | |
| H03K 17/12 | (2006.01) | |

(52) U.S. Cl.
CPC .......... *H03K 17/6872* (2013.01); *H02M 3/07* (2013.01); *H03K 17/122* (2013.01)

(58) Field of Classification Search
CPC .......... H03K 17/6872; H03K 19/0185; H03K 19/0175; H02M 3/07; H03F 3/45; G06F 11/00
USPC ..... 327/108–112, 379, 389, 391; 326/22–27, 326/81–87
See application file for complete search history.

(56) References Cited

U.S. PATENT DOCUMENTS

| | | | |
|---|---|---|---|
| 5,625,306 A | 4/1997 | Tada | |
| 6,704,818 B1 * | 3/2004 | Martin | H03K 17/164 710/100 |
| 6,801,076 B1 | 10/2004 | Merritt | |
| 6,963,219 B1 * | 11/2005 | Ghia | H04L 25/0278 326/30 |
| 7,352,207 B2 * | 4/2008 | Garlapati | H03F 3/3061 326/62 |

(Continued)

FOREIGN PATENT DOCUMENTS

| | | |
|---|---|---|
| CN | 104716826 | 6/2015 |
| TW | I389436 | 3/2013 |
| TW | 201406025 | 2/2014 |

OTHER PUBLICATIONS

"Office Action of Taiwan Counterpart Application," dated Mar. 13, 2018, p. 1-p. 5.

(Continued)

*Primary Examiner* — Brandon S Cole
(74) *Attorney, Agent, or Firm* — JCIPRNET

(57) ABSTRACT

The invention is directed to the selectable mode buffer circuit including a plurality of pads, a mode selecting circuit, and a control circuit. The mode selecting circuit has a plurality of switches, coupled to the pads, and performs a charge pumping operation or an interfacing operating by changing on or off status of at least one of the switches according to a mode selecting signal. The control circuit receives the mode selecting signal, and generates a plurality of input signals for controlling the switches according to the mode selecting signal.

14 Claims, 5 Drawing Sheets

(56) References Cited

U.S. PATENT DOCUMENTS

| | | | |
|---|---|---|---|
| 7,388,422 B2* | 6/2008 | Khan | H02M 3/07 327/112 |
| 7,639,064 B2* | 12/2009 | Hsiao | H03K 17/08142 327/108 |
| 8,311,429 B2* | 11/2012 | Okumura | G03G 15/5004 399/285 |
| 8,384,306 B2 | 2/2013 | Genest | |
| 8,665,009 B2 | 3/2014 | Myers et al. | |
| 9,048,777 B2* | 6/2015 | Thomsen | H02P 27/06 |
| 9,140,741 B2* | 9/2015 | Song | G01R 31/041 |
| 9,588,171 B2* | 3/2017 | Ilkov | G01R 31/2621 |
| 2003/0193364 A1* | 10/2003 | Liu | H02M 3/1588 327/536 |
| 2004/0174215 A1* | 9/2004 | Li | H03F 3/45219 330/253 |
| 2004/0207453 A1* | 10/2004 | Kernhof | H02H 11/003 327/424 |
| 2007/0075776 A1* | 4/2007 | Garlapati | H03F 3/3061 330/259 |
| 2008/0224627 A1 | 9/2008 | Genest | |
| 2009/0091349 A1* | 4/2009 | Bhakta | G11C 7/04 326/30 |
| 2014/0035661 A1 | 2/2014 | Myers et al. | |
| 2014/0266320 A1* | 9/2014 | Conrow | H04B 1/0475 327/108 |
| 2015/0188420 A1 | 7/2015 | Lin | |
| 2016/0247458 A1* | 8/2016 | Muto | G09G 3/344 |

OTHER PUBLICATIONS

Office Action of Taiwan Counterpart Application, dated Oct. 23, 2018, pp. 1-8.

* cited by examiner

CHIP, SELECTABLE MODE BUFFER CIRCUIT AND MODE SELECTING METHOD THEREOF

BACKGROUND

Field of the Invention

The invention is directed to a chip with a selectable mode buffer circuit and a mode selecting method for the selectable mode buffer circuit, and more particularly, to a charge pump circuit and an interface circuit integrated in the selectable mode buffer circuit.

Description of Related Art

In recently years, electronic apparatus are more important for human's life. For some application, a charge pump circuit is needed to be implemented in a chip. As a person skilled in the art knows, the charge pump needs to be connected to a plurality of flying capacitors which are external from the chip. In conventional art, a plurality of specified pads for the charge pump are necessary to be disposed on the chip. Such as that, the number of pads on the chip is increased. Size of the chip is increased correspondingly, and cost of the chip is increased.

SUMMARY

The invention provides a chip having a selectable mode buffer circuit. And the selectable mode buffer circuit is used for integrating an interfacing circuit and a charge pump circuit to reduce circuit size of the chip.

The invention also provides a mode selecting method for setting the selectable mode buffer circuit to perform a charge pump operation or an interfacing function by using same circuit components.

The invention is directed to the selectable mode buffer circuit including a plurality of pads, a mode selecting circuit, and a control circuit. The mode selecting circuit has a plurality of switches, coupled to the pads, and performs a charge pumping operation or an interfacing operating by changing on or off status of at least one of the switches according to a mode selecting signal. The control circuit receives the mode selecting signal, and generates a plurality of input signals for controlling the switches according to the mode selecting signal.

The invention is directed to the chip including a high speed interface circuit and a selectable mode buffer circuit mentioned above.

The invention is also directed to a mode selecting method including: receiving a mode selecting signal, and generating a plurality of input signals according to the mode selecting signal; and performing a charge pumping operation or an interfacing operating by changing on or off status of at least one of the switches according to the mode selecting signal, wherein the switches are controlled by the input signals.

To sum up, the present invention provides the selectable mode buffer circuit for performing the charge pump function or the interfacing function by using same circuit components. That is, a charge pump circuit and an interfacing circuit can be integrated into the selectable mode buffer circuit in the chip by using same circuit components. The size of the chip can be reduced, and cost of the chip can be saved.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
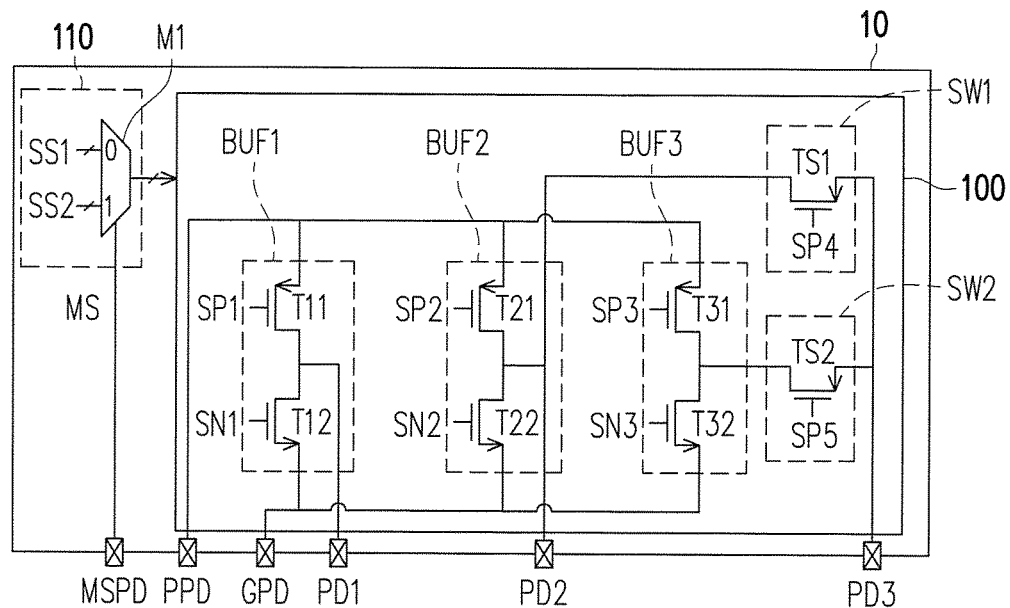
FIG. 1 illustrates a schematic diagram of a selectable mode buffer circuit according to an embodiment of present disclosure.

Please refer to FIG. 1, FIG. 1 illustrates a schematic diagram of a selectable mode buffer circuit according to an embodiment of present disclosure. The selectable mode buffer circuit 10 includes a mode selecting circuit 100, a control circuit 110, and a power pad PPD, a ground pad GPD, and first to third pads PD1-PD3. The mode selecting circuit 100 has a plurality of switches, and performs a charge pumping operation or an interfacing operating by changing on or off status of at least one of the switches according to a mode selecting signal MS. The controller circuit 110 is coupled to the selectable mode buffer circuit 10 and generates a plurality of input signals for controlling the switches according to the mode selecting signal MS.

That is, the mode selecting circuit 100 may be configured to a first configuration or second configuration by changing on or off status of at least one of the switches. The mode selecting circuit 100 is used to be an interface circuit when the mode selecting circuit 100 is configured to the first configuration, and the mode selecting circuit 100 is used to be a charge pump circuit when the mode selecting circuit 100 is configured to the second configuration.

In detail, the mode selecting circuit 100 includes buffers BUF1-BUF3, switches SW1-SW2, and a control circuit 110, and the buffers BUF1-BUF3 are formed by a plurality of transistor switches. The buffer BUF1 is coupled to the power pad PPD for receiving a power voltage, and is coupled to the ground pad GPD for receiving a ground voltage. An input end of the buffer BUF1 receives an input signal including two sub-signals SP1 and SN1, and an output end of the buffer BUF1 is coupled to the first pad PD1. The buffer BUF2 is coupled to the power pad PPD for receiving the power voltage, and is coupled to the ground pad GPD for receiving the ground voltage. An input end of the buffer BUF2 receives an input signal including two sub-signals SP2 and SN2, and an output end of the buffer BUF2 is coupled to the second pad PD2. Furthermore, the output end of the buffer BUF2 is also coupled to the switch SW1. The buffer BUF3 is coupled to the power pad PPD for receiving the power voltage, and is coupled to the ground pad GPD for receiving the ground voltage. An input end of the buffer BUF3 receives an input signal including two sub-signals SP3 and SN3, and an output end of the buffer BUF3 is coupled to the switch SW2. The switch SW1 is coupled between the buffer BUF2 and the third pad PD3, and the switch SW2 is coupled between the buffer BUF3 and the third pad PD3. The switches SW1 and SW2 are respectively controlled by input signals SP4 and SP5. The control circuit 110 is coupled to the buffers BUF1-BUF3 and the switches SW1-SW2. The control circuit 110 is also coupled to a pad MSPD for receiving the mode selecting signal MS, and generates the input signals including the sub-signals SP1-SP3, SN1-SN3 and input signals SP4 and SP5.

In this embodiment, the buffer BUF1 includes a transistor T11 and a transistor T12. The transistor T11 may be a P-type transistor. A first end of the transistor T11 is coupled to the power pad PPD, a second end of the transistor T11 is coupled to the first pad PD1, and a control end of the transistor T11 receives the sub-signal SP1. The transistor T12 may be a N-type transistor. A first end of the transistor T12 is coupled to the first pad PD1, a second end of the transistor T12 is coupled to the ground pad GPD, and a control end of the transistor T12 receives the sub-signal SN1. The buffer BUF2 includes transistors T21 and T22. The transistor T21 may be a P-type transistor and the transistor T22 may be a N-type transistor. A first end of the transistor T21 is coupled to the power pad PPD, a second end of the transistor T21 is coupled to the second pad PD2 and the switch SW1, and a control end of the transistor T21 receives the sub-signal SP2. A first end of the transistor T22 is coupled to the second pad PD2, a second end of the transistor T22 is coupled to the ground pad GPD, and a control end of the transistor T22 receives the sub-signal SN2. Moreover, the buffer BUF3 includes transistors T31 and T32. The transistor T31 may be a P-type transistor and the transistor T32 may be a N-type transistor. A first end of the transistor T31 is coupled to the power pad PPD, a second end of the transistor T31 is coupled to the switch SW2, and a control end of the transistor T31 receives the sub-signal SP3. A first end of the transistor T32 is coupled to the switch SW2, a second end of the transistor T32 is coupled to the ground pad GPD, and a control end of the transistor T32 receives the sub-signal SN3. The switches SW1 and SW2 are transistor switches, and are respectively formed by transistors TS1 and TS2. The transistors TS1 and TS2 are respectively controlled by input signals SP4 and SP5, and both of the transistors TS1 and TS2 may be P-type transistors.

The controller circuit 110 may include a multiplexer M1. The multiplexer M1 receives signal sets SS1 and SS2, and the mode selecting signal MS. The multiplexer M1 selects one of the signal sets SS1 and SS2 for generating the sub-signals SP1-SP3, SN1-SN3 and input signals SP4 and SP5 according to the mode selecting signal MS.

Figure 2:
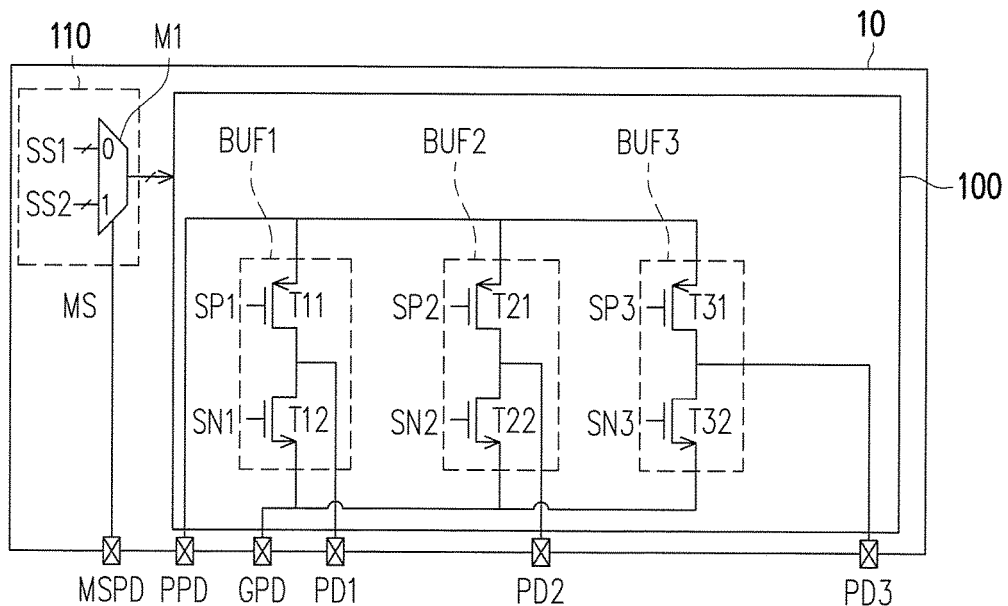
FIG. 2 and FIG. 3 respectively illustrate schematic diagrams of equivalent circuits of the selectable mode buffer circuit according to an embodiment of present disclosure.
Figure 3:
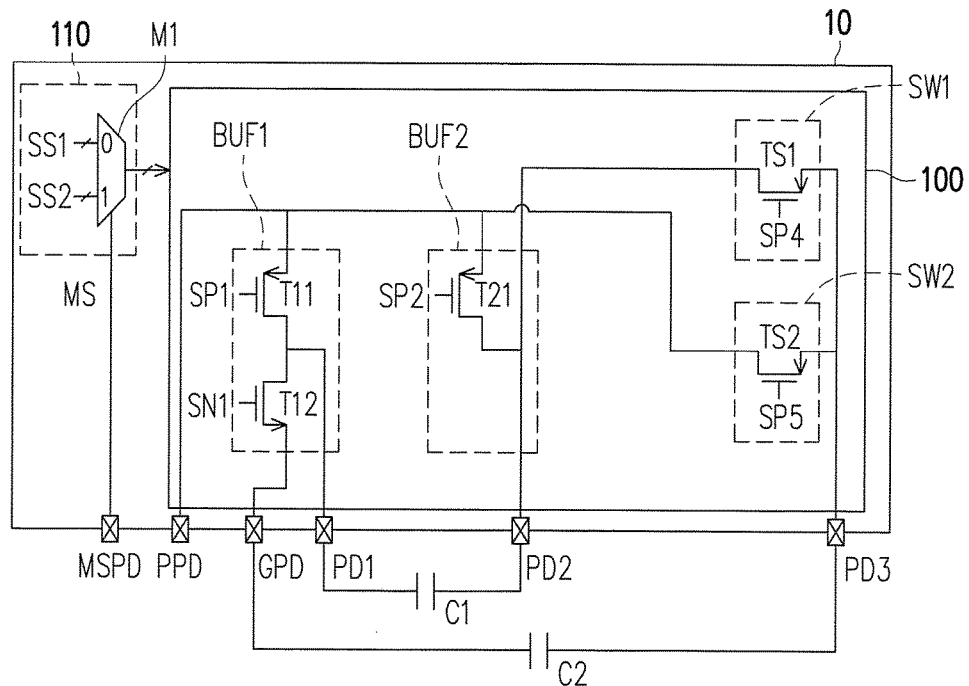

In detail operation, please refer to FIG. 1, FIG. 2 and FIG. 3, wherein FIG. 2 and FIG. 3 respectively illustrate schematic diagrams of equivalent circuits of the selectable mode buffer circuit according to an embodiment of present disclosure.

In FIG. 2, the mode selecting circuit 100 is working in a general interface mode. In the general interface mode, the control circuit 110 receives the mode selecting signal MS corresponding to the general interface mode. For example, the mode selecting signal MS may be in logic level "1". The control circuit 110 may select a signal set SS2 to generate the sub-signals SP1-SP3, SN1-SN3 and input signals SP4 and SP5. Such as that, the switch SW1 is always cut-off according to the input signal SP4 and the switch SW2 is always turned on according to the input signal SP5, and the circuit configuration of mode selecting circuit 100 the can be referred to FIG. 2.

It can be easily seen in FIG. 2, the mode selecting circuit 100 performs a general interface circuit in the general interface mode. The buffers BUF1-BUF3 perform normal I/O buffers for the selectable mode buffer circuit 10 in the general interface mode. Besides, in the general interface mode, the sub-signals SP1 and SN1 may be the same, the sub-signals SP2 and SN2 may be the same, and the sub-signals SP3 and SN3 may be the same. And, in buffer BUF1, at most one of the transistors T11 and T12 is turned on, in buffer BUF2, at most one of the transistors T21 and T22 is turned on, and in buffer BUF3, at most one of the transistors T31 and T32 is turned on.

In FIG. 3, the mode selecting circuit 100 is working in a charge pumping mode. In the charge pumping mode, the control circuit 110 receives the mode selecting signal MS corresponding to the charge pumping mode. For example, the mode selecting signal MS may be in logic level "0". The control circuit 110 may select a signal set SS1 to generate the sub-signals SP1-SP3, SN1-SN3 and input signals SP4 and SP5. By referring to FIG. 1, such as that, the transistor T22 of the buffer BUF2 and the transistor T32 of the buffer BUF3 are always cut-off according to the sub-signals SN2 and SN3 respectively, the transistor T31 of the buffer BUF3 is always turned on according to the sub-signal SP3, and the circuit configuration of mode selecting circuit 100 the can be referred to FIG. 3.

In the charge pumping mode, the mode selecting circuit 100 is configured to a charge pump circuit. For performing charge pump operation, a capacitor C1 is coupled between the first pad PD1 and the second PD2, and a capacitor C2 is coupled between the ground pad GPD and the third pad PD3. At beginning of normal operation, the transistor of BUF1, BUF2 and SW1 turn off but SW2 turns on. The voltage level on the third pad PD3 can be pre-charged to VDD through SW2 switch.

In the operation of the charge pump circuit, in the buffer BUF1, the transistor T11 is cut-off and the transistor T12 is turned on, and the first pad PD1 is grounded to the ground pad GPD during a first time period. In the first time period, the transistor T21 of the buffer BUF2 is turned on for connecting the power pad PPD to the second pad PD2, and the power voltage can to transported from the capacitor C1 to the ground pad GPD for charging the capacitor C1 to VDD×1 (a voltage level of the power voltage is VDD). Additional, in the first time period, the switch SW1 is cut-off, and the capacitor C2 can keep on providing charge to a load.

After the first time period, during a second time period, the transistors T12 and T21 are cut-off, and the transistor T11 is turned on, and a voltage level on the first pad PD1 is raised to the power voltage VDD, and a voltage level on the second pad PD2 is pumped to VDD×2 correspondingly. Furthermore, the switch SW1 is turned on during the second tune period. Such as that, the voltage on the second pad PD2 can be charged to the capacitor C2, and a voltage level on the third pad PD3 can be charged to VDD×2, and the charge pump operation can be completed.

Figure 4:
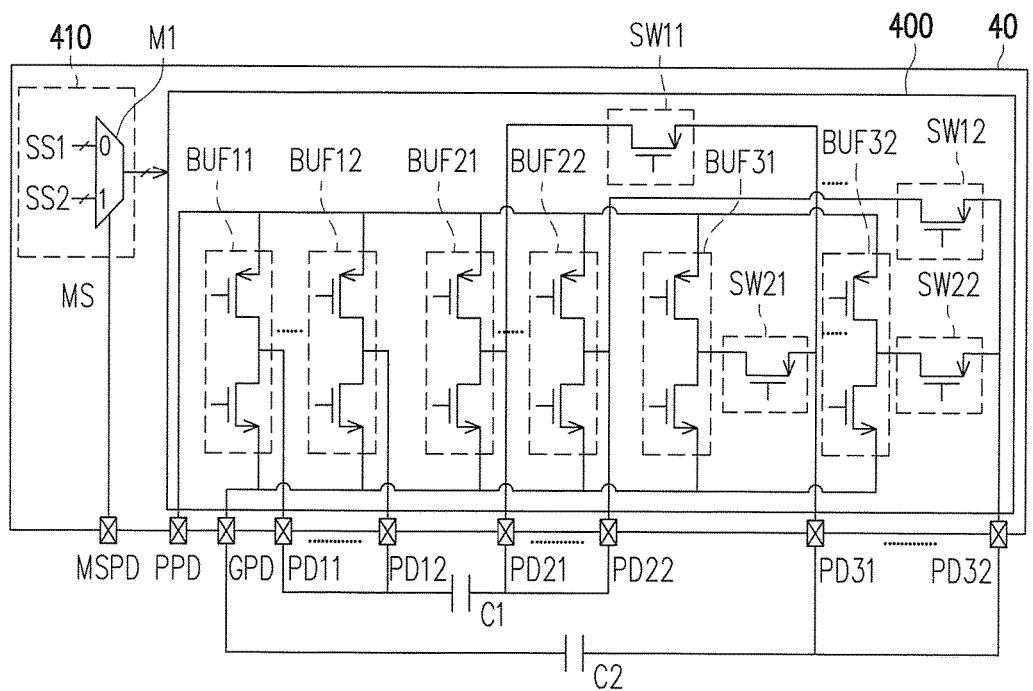
FIG. 4 illustrates a schematic diagram of a selectable mode buffer circuit according to another embodiment of present disclosure.

Please refer to FIG. 4, FIG. 4 illustrates a schematic diagram of a selectable mode buffer circuit according to another embodiment of present disclosure. The selectable mode buffer circuit 40 may be disposed in a chip, and includes a mode selecting circuit 400. The mode selecting circuit 400 includes buffers BUF11-BUF12, BUF21-BUF22, and BUF31-BUF32, switches SW11-SW12 and SW21-SW22, and a control circuit 410. There are a plurality of first pads PD11-PD12 disposed on the chip, a plurality of second pads PD21-PD22 disposed on the chip, and a plurality of third pads PD31-PD32 disposed on the chip. In this embodiment, the first pads PD11-PD12 are respectively coupled to the buffers BUF11-BUF12, and the first pads PD11-PD12 are coupled together to a first end of the capacitor C1. The second pads PD21-PD22 are respectively coupled to the buffers BUF21-BUF22, and the second pads PD21-PD22 are coupled together to a second end of the capacitor C1. Further, first ends of the switches SW11-SW12 are respectively coupled to the output ends of the buffer BUF21 and BUF22, and second ends of the switches SW11-SW12 are respectively coupled to the third pads PD31 and PD32. First ends of the switches SW21-SW22 are respectively coupled to the output ends of the buffer BUF31 and BUF32, and second ends of the switches SW21-SW22 are respectively coupled to the third pads PD31 and PD32. Besides, all of the third pad PD31-PD32 are coupled together to a first end of the capacitor C2, and a second end of the capacitor C2 is coupled to the ground pad GPD.

In this embodiment, a plurality of buffers are coupled in parallel for enhance driving abilities on each of the first to third pads. The chip 40 can be used for driving a load with larger current consumption.

In operation, in the general interface mode, the switches SW11-SW12 may be always cut-off, and the switches SW21-SW22 may be always turned on, and the buffers BUF11-BUG12, BUF21-BUF22, and BUF31-BUF32 may perform as I/O buffers.

At beginning of normal operation, the transistor of the buffers BUF11-BUF12, BUF21-BUF22, BUF31-BUF32 and the switches SW11-SW12 turn off but SW21-SW22 turns on. The voltage level on the third pads PD31-PD32 can be pre-charged to the power voltage VDD through the switches SW21-SW22. In the operation of the charge pump circuit, during a first time period, the PMOS switches of the buffers BUF21-BUF22 and NMOS switches of the buffers BUF11-BUF12 provide a current path from power voltage to ground and charge the capacitor C1 to VDD×1 from the second pads PD21-PD22 to the first pads PD11-PD12. And then, during a second time period, the PMOS switches of buffers BUF11-BUF12 provides the power voltage to the first pad PD11-PD12 for pumping up the voltage level on the second pads PD21-PD22 to VDD×2. Besides, the switches SW11-SW12 provides the voltage on the second pads PD21-PD22 to the third pads PD31-PD32, and the voltage level (VDD×2) on the third pads PD31-PD3 can be charged to the capacitor C2. Therefore, the pump voltage VDD×2 would be generated.

Figure 5:
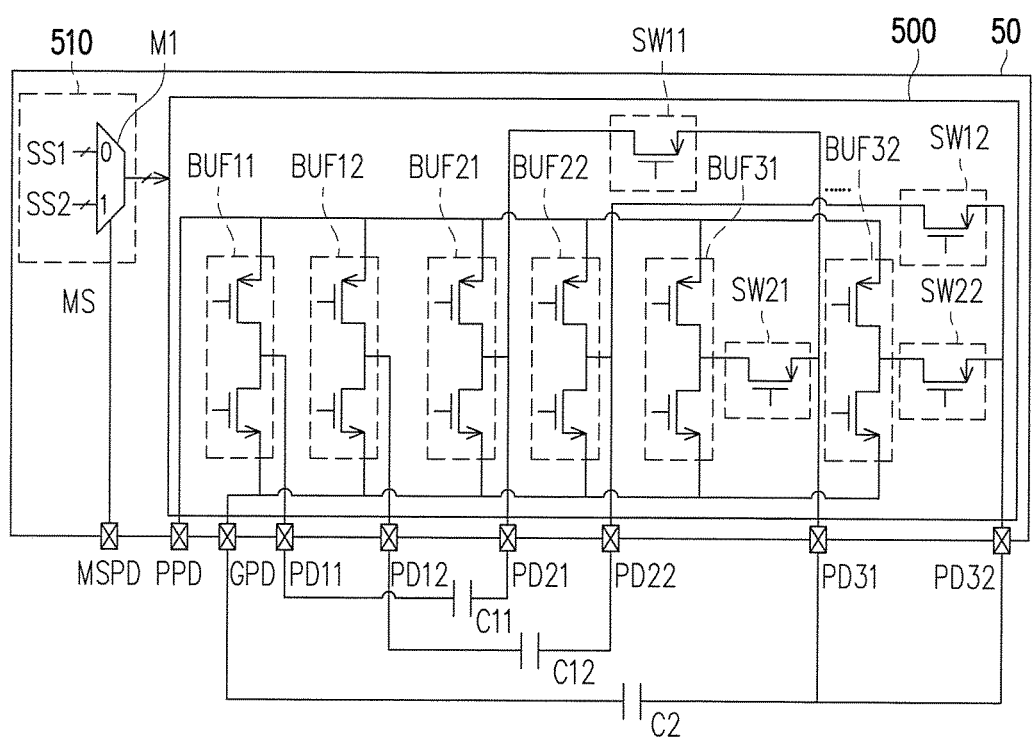
FIG. 5 illustrates a schematic diagram of a selectable mode buffer circuit according to another embodiment of present disclosure.

Please refer to FIG. 5, FIG. 5 illustrates a schematic diagram of a selectable mode buffer circuit according to another embodiment of present disclosure. The selectable mode buffer circuit 50 may be disposed in a chip, and includes a mode selecting circuit 500. The mode selecting circuit 500 includes buffers BUF11-BUF12, BUF21-BUF22, and BUF31-BUF32, switches SW11-SW12 and SW21-SW22, and a control circuit 510. Different from the mode selecting circuit 500, in the mode selecting circuit 500, the first pads PD11 and PD12 are not connected together, and the first pads PD11 and PD12 are respectively coupled to first ends of capacitors C11 and C12. Further, the second pads PD21 and PD22 are not connected together, and the second pads PD21 and PD22 are respectively coupled to second ends of capacitors C11 and C12. In this embodiment, the buffers BUF11, BUF21, BUF31, the capacitor C11, the switches SW11 and SW21 form a first phase circuit, and the buffers BUF12, BUF22, BUF32, the capacitor C12, the switches SW12 and SW22 form a second phase circuit. The first phase and second phase circuits can operated in complementary phases, and the capacitors C11 and C12 may provide pumped voltage (equals to VDD×2) to charge the capacitor C2 alternatively. Such as that, the power providing efficiency on the third pads PD31-PD32 can be further improved.

Figure 6A:
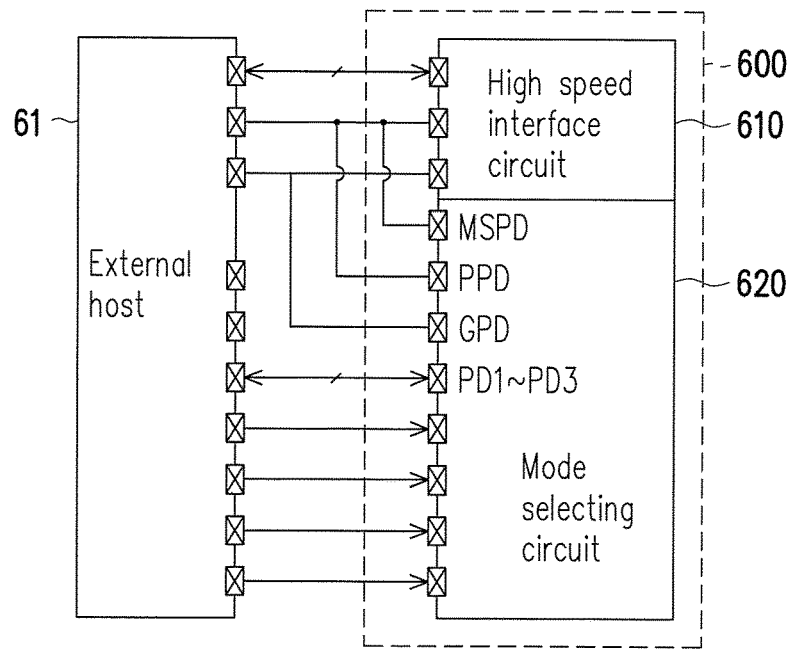
FIG. 6A and FIG. 6B illustrate block diagrams of a chip working in two different modes according an embodiment of present disclosure.
Figure 6B:
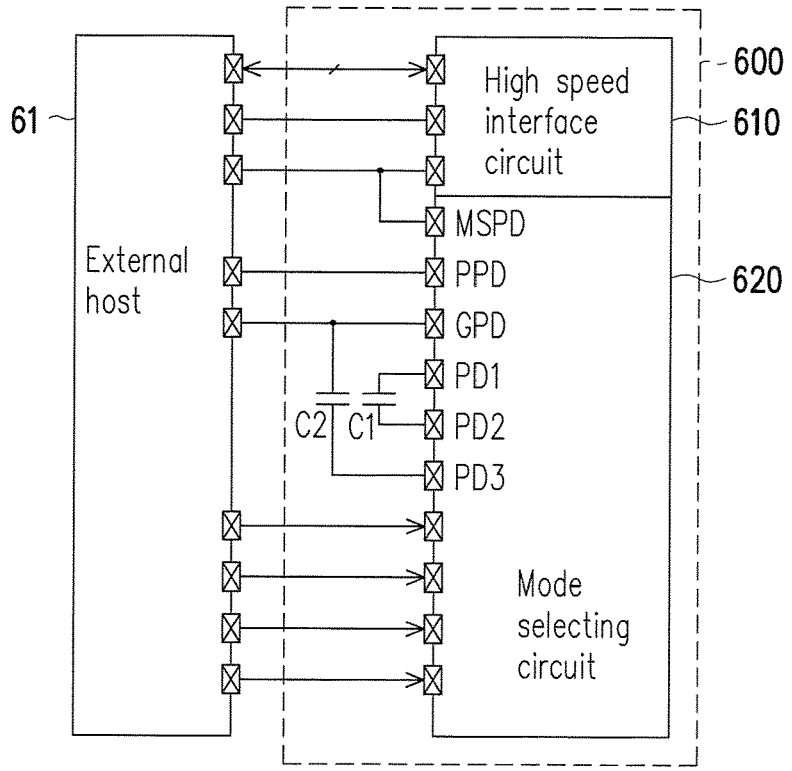

Please refer to FIG. 6A and FIG. 6B. FIG. 6A and FIG. 6B illustrate block diagrams of a chip working in two different modes according an embodiment of present disclosure. In FIG. 6A, the chip 600 is working in the general interface mode. The chip 600 includes a high speed interface 610 and a selectable mode buffer circuit 620. A mode selecting pad MSPD, a power pad PPD, a ground GPD, and first to third pads are disposed on the chip 600. The chip 600 may be connected to an external host 61. The mode selecting pad MSPD may be coupled to the external host 61 to receive the mode selecting signal from the external host 61, and the power pad PPD and the round pad GPD are respectively coupled to a power pad and a ground pad of the external host 61. Furthermore, the first to third pad PD1-PD3 of the chip 600 are respectively coupled to normal I/O pads of the external host 61.

In the general interface mode, the selectable mode buffer circuit 620 performs an I/O interface circuit and is used to transmit data with the external host 61.

On the other hand, in FIG. 6A, the chip 600 is working in the charge pump mode. Different from FIG. 6A, a capacitor C1 is coupled between the first pad PD1 and the second pad PD2, and a capacitor C2 is coupled between the ground pad GPD and the third pad PD3. In the charge pump mode, the selectable mode buffer circuit 620 performs a charge pump circuit, and is used to generate a pumped voltage on the third pad PD3.

Figure 7:
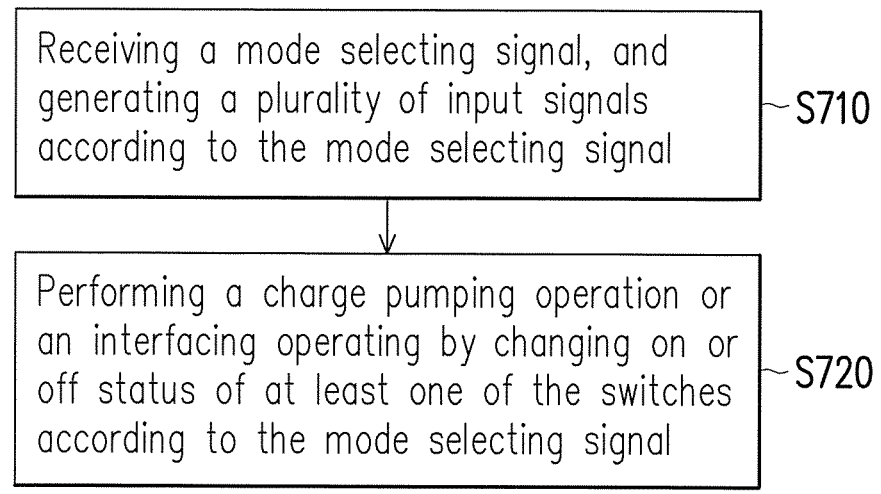
FIG. 7 illustrates a flow chart of a mode selecting method according to an embodiment of present disclosure.

Please refer to FIG. 7, FIG. 7 illustrates a flow chart of a mode selecting method according to an embodiment of present disclosure. In a step S710, a mode selecting signal is received, and a plurality of input signals are generated according to the mode selecting signal. In a step S720, a charge pumping operation or an interfacing operating is performed by changing on or off status of at least one of the switches according to the mode selecting signal, wherein, the switches are controlled by the input signals. The detail operation about the steps S710-S730 may be referred to the embodiments mentioned above, and no more repeated description here.

To conclude, in the present disclosure, a selectable mode buffer circuit of a chip is provided, and the selectable mode buffer circuit can be configured to a charge pump circuit or an I/O interface circuit. That is, the circuit components and pads of the charge pump circuit and the I/O interface circuit can be used commonly, and the size of the chip can be reduced accordingly.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A selectable mode buffer circuit, comprising:
   a plurality of pads;
   a binary mode selecting circuit, having a plurality of switches, coupled to the pads, the binary mode selecting circuit selecting only one of a charge pumping operation and an interfacing operation for operating according to on or off status of at least one of the switches changed by a mode selecting signal; and
   a control circuit, receiving the mode selecting signal, and generating a plurality of input signals for controlling the switches according to the mode selecting signal,
   wherein, when the binary mode selecting circuit selecting the charge pumping operation for operating, the binary mode selecting circuit pumps up a power voltage to generate an output voltage,
   when the binary mode selecting circuit selecting the interfacing operation for operating, the binary mode selecting circuit buffers an input signal to generate an output signal.

2. The selectable mode buffer circuit according to claim 1, wherein the binary mode selecting circuit comprises:
   at least one first buffer, having an input end for receiving a first input signal and an output end coupled to at least one first pad;
   at least one second buffer, having an input end for receiving a second input signal and an output end coupled to at least one second pad;
   at least one first switch, coupled between the output end of the at least one second buffer and a third pad, and being controlled by a fourth input signal;
   at least one third buffer, having an input end for receiving a third input signal; and
   at least one second switch, coupled between an output end of the third buffer and the third pad, and being controlled by a fifth input signal.

3. The selectable mode buffer circuit according to claim 2, wherein if the mode selecting signal corresponds to a general interface mode, the at least one first switch is cut-off and the at least one second switch is turned on, and if the mode selecting signal corresponds to an charge pumping mode, the at least one first switch is turned on and cut-off alternatively according to the fourth forth input signal and the at least one second switch is cut-off according to the fifth input signal, respectively.

4. The selectable mode buffer circuit according to claim 3, wherein the at least one first buffer comprises:
   a first transistor, having a first end, a second end and a control end, wherein the first end of the first transistor is coupled to a power pad, the second end of the first transistor is coupled to the first pad, and the control end of the first transistor receives a first sub-signal of the first input signal; and
   a second transistor, having a first end, a second end and a control end, wherein the first end of the second transistor is coupled to the first pad, the second end of the second transistor is coupled to a ground pad, and the control end of the second transistor receives a second sub-signal of the first input signal.

5. The selectable mode buffer circuit according to claim 3, wherein the at least one second buffer comprises:
   a first transistor, having a first end, a second end and a control end, wherein the first end of the first transistor is coupled to a power pad, the second end of the first transistor is coupled to the second pad, and the control end of the first transistor receives a first sub-signal of the second input signal; and
   a second transistor, having a first end, a second end and a control end, wherein the first end of the second transistor is coupled to the second pad, the second end of the second transistor is coupled to a ground pad, and the control end of the second transistor receives a second sub-signal of the second input signal,
   wherein, if the mode selecting signal corresponds to the charge pumping mode, the second transistor is cut off according to the second sub-signal of the second input signal, and the first transistor is turned on and cut-off alternatively according to the first sub-signal of the second input signal.

6. The selectable mode buffer circuit according to claim 3, wherein the at least one third buffer comprises:
   a first transistor, having a first end, a second end and a control end, wherein the first end of the first transistor is coupled to a power pad, the second end of the first transistor is coupled to the third pad, and the control end of the first transistor receives a first sub-signal of the fourth input signal; and
   a second transistor, having a first end, a second end and a control end, wherein the first end of the second transistor is coupled to the third pad, the second end of the second transistor is coupled to a ground pad, and the control end of the second transistor receives a second sub-signal of the fourth input signal,
   wherein, if the mode selecting signal corresponds to the charge pumping mode, the second transistor is cut off according to the second sub-signal of the fourth input signal, and the first transistor is turned on according to the first sub-signal of the fourth input signal.

7. The selectable mode buffer circuit according to claim 2, wherein if the mode selecting signal corresponds to the charge pumping mode, the at least one first pad is coupled to a first end of at least one first capacitor, the at least one second pad is coupled to a second end of the at least one first capacitor, and the at least one third pad is coupled to a first end of at least one second capacitor,
   wherein, a second end of the at least one second capacitor is coupled to a ground pad.

8. The selectable mode buffer circuit according to claim 2, wherein the control circuit comprises:
   a multiplexer, receiving a first signal set, a second signal set and the mode selecting signal,
   wherein the multiplexer selects one of the first and second signal sets to generate the first to fifth input signal according to the mode selecting signal.

9. A chip, comprising:
   a high speed interface circuit; and
   the selectable mode buffer circuit as claimed in claim 1.

10. A mode selecting method, comprising:
    receiving a mode selecting signal, and generating a plurality of input signals according to the mode selecting signal; and
    selecting only one of a charge pumping operation and an interfacing operation for operating according to on or off status of at least one of the switches changed by the mode selecting signal with binary value,
    wherein, the switches are controlled by the input signals,
    wherein, when the charge pumping operation is selecting for operating, a power voltage is pumping up to generate an output voltage by a mode selecting circuit, when the interfacing operation is selecting for operating, an input signal is buffering to generate an output signal by the mode selecting circuit.

11. The mode selecting method according to claim 10, wherein step of performing the charge pumping operation or the interfacing operating by changing on or off status of the at least one of the switches according to the mode selecting signal comprises:
   providing at least one first buffer coupled to a first pad;
   providing at least one second buffer coupled to a second pad though at least one first switch, and providing at least one third buffer coupled to a third pad though at least one second switch;
   generating first to fifth input signals according to the mode selecting signal, and respectively providing the first to fifth input signals to the at least one first buffer, the at least one second buffer, the at least one first switch, the at least one third buffer, and the at least one second switch.

12. The mode selecting method according to claim 11, wherein if the mode selecting signal corresponds to a general interface mode, the at least one first switch is cut-off and the at least one second switch is turned on, and if the mode selecting signal corresponds to an charge pumping mode, the at least one first switch is turned on and cut-off alternatively according to the fourth forth input signal and the at least one second switch is cut-off according to the fifth input signal, respectively.

13. The mode selecting method according to claim 11, further comprising:
   if the mode selecting signal corresponds to the charge pumping mode, coupling the at least one first pad to a first end of at least one first capacitor, coupling the at least one second pad to a second end of the at least one first capacitor, coupling the at least one third pad to a first end of at least one second capacitor, and coupling a second end of the at least one second capacitor to a ground pad.

14. The mode selecting method according to claim 11, further comprising:
   selecting one of a first signal set and a second signal set to generate the first to fifth input signals according to the mode selecting signal.

* * * * *